United States Patent [19]
Mullen, III et al.

[11] Patent Number: 5,427,865
[45] Date of Patent: Jun. 27, 1995

[54] MULTIPLE ALLOY SOLDER PREFORM

[75] Inventors: William B. Mullen, III, Boca Raton; Kingshuk Banerji, Plantation; Edwin L. Bradley, III, Sunrise; Vahid Kazem-Goudarzi, Sunrise, all of Fla.

[73] Assignee: Motorola, Inc., Schaumburg, Ill.

[21] Appl. No.: 236,614

[22] Filed: May 2, 1994

[51] Int. Cl.6 ............................... B22F 7/02
[52] U.S. Cl. .................... 428/559; 428/546; 428/548; 428/553; 428/558; 428/567
[58] Field of Search ............ 428/546, 548, 553, 558, 428/559, 647; 228/180.2; 361/760; 420/557

[56] References Cited

U.S. PATENT DOCUMENTS

| | | | |
|---|---|---|---|
| 4,778,733 | 10/1988 | Lubrano et al. | 428/647 |
| 4,967,950 | 11/1990 | Legg et al. | 228/180.2 |
| 5,154,341 | 10/1992 | Melton et al. | 228/180.2 |
| 5,229,070 | 7/1993 | Melton et al. | 420/557 |
| 5,233,504 | 8/1993 | Melton et al. | 361/760 |
| 5,320,272 | 6/1994 | Melton et al. | 228/180.2 |

*Primary Examiner*—Donald P. Walsh
*Assistant Examiner*—John N. Greaves
*Attorney, Agent, or Firm*—Dale W. Dorinski

[57] ABSTRACT

A solder preform (250) has solder particles of one alloy (210) arranged within a matrix of a second solder alloy (200). This arrangement forms a structure having the desired predetermined shape of the solder preform. The solder particles comprise one or more of the following elements: tin, lead, bismuth, indium, copper, antimony, cadmium, arsenic, aluminum, gallium, gold, silver. The particles have a predetermined melting temperature. The second solder alloy is compositionally distinct from the solder particles, and has a melting temperature that is lower than the melting temperature of the solder particles. The solder particles may comprise about 88% by weight of the solder preform, and the second solder alloy comprises about 12% by weight of the preform.

11 Claims, 1 Drawing Sheet

MULTIPLE ALLOY SOLDER PREFORM

CROSS REFERENCE TO RELATED APPLICATIONS

This application is related to U.S. patent application Ser. No. 08/236,677, filed May 2, 1994 entitled "Soldering Process" by Vahid Kazem-Goudarzi, Henry F. Liebman, Kingshuk Banerji, William B. Mullen, III, and Edwin L. Bradley, III, incorporated herein by reference, and to U.S. patent application Ser. No. 08/236,615, filed May 2, 1994 entitled "Solder Clad Substrate," by Vahid Kazem-Goudarzi, Edwin L. Bradley, III, Kingshuk Banerji, and Henry F. Liebman, both of which are filed concurrently herewith and both of which are assigned to Motorola, Inc.

TECHNICAL FIELD

This invention relates in general to solder alloys, and more particularly to a solder preform utilizing multiple solder alloys each having a unique melting temperature.

BACKGROUND

Soft solder is a fusible alloy, typically consisting of tin and lead, which is used for the purpose of joining together two or more metals at temperatures below their melting points. In addition to tin and lead, solders may occasionally contain varying amounts of other materials, such as antimony, bismuth, cadmium, or silver, which are typically added for the purpose of varying the physical properties of the alloy. However, in many solders, some of these elements, notably antimony, are only present as impurities. Solder is widely used in the electronics industry for attaching electrical components to printed circuit boards (PCB). In order to successfully attach the electrical components to the PCB, there must be a metallurgical affinity between the two metals that are going to be soldered together, the metals must be free from all non-metallic surface contamination, and there must be complete and adequate metallic contact between the solder and the metals that are to be soldered, and there must be a temperature adequate for sufficient alloying of the metal. The solder provides the attachment by virtue of an intermetallic solution, which takes place at the soldering temperature.

One method of assembling electronic assemblies utilizes solder preforms. Solder preforms, or solder forms, are pieces of solder formed into predetermined geometric shapes. The preforms are particularly suited to those operations which require a given or predetermined volume of solder to be applied to a relatively inaccessible portion of an assembly. In many cases, the parts are assembled with the solder preform in proper position and alignment. When heat is applied, the solder preform melts and the predetermined volume of solder is released at the desired point. Preforms lend themselves to virtually all types of heat application such as induction heat, conductive, and convective reflow. They are well adapted to mass production where the number of units that can be soldered at one time is limited only by the capacity of the reflow oven. The obvious advantage of solder preforms is the ability to precisely place a predetermined amount of solder directly on the PCB, without having to print solder paste. One of the disadvantages of this method is that the preforms are expensive and when reflowed on a bare PCB, it results in a domed surface on the solder pads. The domed surfaces degrade the accuracy of the subsequent component placement process. The parts and flux tend to slide off of the domed surface when the circuit board is subjected to accelerations while moving down the assembly line. Some have attempted to solve this problem by reducing the amount of solder used in the preform, thus decreasing the curvature of the domed surface. However, reducing the volume of solder decreases the total wetting forces of the solder on the pad and, therefore, reduces the tendency of the components to self-center during the assembly reflow operation. This self-centering tendency is extremely important to assure accurate alignment and high-yield soldering. In addition, one would like to maximize the amount of solder in order to create a full solder fillet between the component and the PCB.

Clearly, it would be a benefit to the electronics industry if a solder preform could be devised that includes the advantages of solder cladding, solder printing and conventional solder preforms.

SUMMARY OF THE INVENTION

Briefly, according to the invention, a solder preform comprises solder particles of one alloy arranged within a matrix of a second solder alloy. This arrangement forms a structure having the desired predetermined shape of the solder preform. The solder particles comprise one or more of the following elements: tin, lead, bismuth, indium, copper, antimony, cadmium, arsenic, aluminum, gallium, gold, silver and alloys thereof. The particles have a predetermined melting temperature. The second solder alloy has a melting temperature that is lower than the predetermined melting temperature of the solder particles.

In an alternate embodiment of the invention, the solder particles comprise about 88% by weight of the solder preform, and the second solder alloy comprises about 12% by weight of the preform.

DETAILED DESCRIPTION OF THE PREFERRED EMBODIMENT

Figure 1:
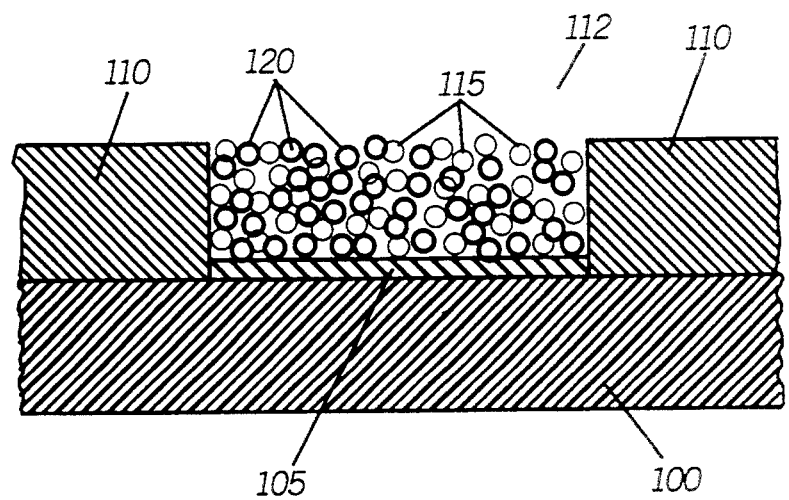
FIG. 1 is a cross sectional view of the solder preform prior to reflow, in accordance with the invention.

While the specification concludes with claims defining the features of the invention that are regarded as novel, it is believed that the invention will be better understood from a consideration of the following description in conjunction with the drawing figures. The drawings are not to scale, in order to add clarity to the drawing.

Most solders are alloys of tin and lead. Pure lead melts at 327° C. and pure tin melts at 232° C. When these two metals are mixed, it results in a composition having a lower melting point than either of the individual components. Depending upon the percentage composition of the tin and lead, the melting point will vary. However, there is one alloy having a composition of 63% tin and 37% lead, known as the eutectic composition, that has the lowest melting point (183° C.) of any of the possible mixtures. This eutectic composition has the characteristic of having a sharp and distinct melting point precisely at this temperature. That is, the solder alloy undergoes a phase change from solid to liquid at this point. All other compositions of tin and lead, other than the eutectic, are mixtures which do not melt sharply at any one temperature, but which pass through an intermediate range of plasticity in cooling from the liquid to the solid state. In fact, it is traditional for metallurgical purposes to consider tin-lead solder not as an alloy of tin and lead, but rather as a eutectic alloy plus lead, or a eutectic alloy plus tin, as the case may be. Although really a mixture, the eutectic composition possesses the metallurgical properties of a single pure constituent.

These various alloys that pass through an intermediate range of plasticity are said to have a melting range. Above the melting range, the alloy is a liquid. Below the melting range, the alloy is a solid. However, within the melting range, it is a plastic-like material that cannot be defined strictly as a liquid nor as a solid. The lower temperature of the melting range is known as the solidus temperature, and the upper temperature of the melting range is known as the liquidus temperature. At temperatures below the solidus temperature, the alloy is a solid, and at temperatures above the liquidus temperature, the alloy is a liquid. Materials other than tin and lead may be added to the alloy and will cause similar types of behavior. Examples of some materials are aluminum, antimony, arsenic, bismuth, cadmium, copper, gallium, gold, indium, iron, nickel, silver, and zinc. Because many solder alloys exhibit a melting range rather than a pure melting point, a great deal of confusion exists over exactly what point may be considered to be the melting point of solder. For purposes of this invention, the melting point of a solder is considered to be that point at which the alloy transitions from a solid either to a liquid or to a plastic type composition; that is the melting point may be considered to be equivalent to the lower end of the melting range, or the solidus point.

This invention provides a solder preform that can be used in printed circuit assemblies and other solder assembly operations. It improves the accuracy and reliability of the soldered joint. In the preferred embodiment of the invention, the solder preform is made from a solder paste or soldering composition made from powders of the solder alloys. Each of the alloys has a melting point or range that is different from the other. The metallic portion of the solder paste consists of a mixture of 88% by weight of a tin-lead-silver alloy (melting point 179°-181° C.) and 12% by weight of a tin-lead-bismuth alloy (melting range of about 144° C.-163° C). The tin-lead-silver alloy is about 62% tin, 36% lead, and 2% silver, whereas the tin-lead-bismuth alloy is about 43% tin, 43% lead, and 14% bismuth. Each solder alloy is in the form of finely divided particles (such as spheres or irregularly shaped particles), and the mixture of the two alloys is suspended in a matrix of a vehicle and a fluxing agent. The tin-lead-bismuth solder alloy is referred to as the low temperature alloy. Although the preferred embodiment employs two solder alloys, three or more distinct alloys could be mixed, for example, and still be considered to be within the spirit and scope of the invention.

Referring now to FIG. 1, a substrate 100 has a surface that is not wettable by the soldering composition. Examples of some suitable types of substrates are glass or ceramic plates, fluoropolymer sheets or films, plastic sheets or films, or other metals that are not solderable to the solder alloys. The main criteria for the substrate is that it must not be considered to be a 'solderable' substrate for the solder paste in question. This is determined by many factors well known to those skilled in the art, some of these being the type of flux used in the paste, the metallurgy of the individual alloys and the alloy mix, and the temperatures used to reflow the solder. A mask 110 having openings 112 corresponding to the desired shapes of the solder preforms is placed over the non-wettable substrate. The mask 110 can be temporary or permanent, depending on the desires of the user. The mask 110 is of sufficient thickness so as to create a solder preform of the desired finished thickness. Some examples of useful types of masks are metal stencils, raised portions of the substrate itself, or permanent photodefined resists. As in the case of the substrate, the mask should be non-wettable by the solder in order to prevent adhesion or alloying of the solder to the mask. The openings in the mask can be of any desired shape, for example, round, square, triangular, irregular, etc. Typically, preforms used in the electronic industry are small, but the mask and substrate can be made very large to make many preforms or preforms for other applications as well.

The substrate and mask are then printed with the dual-alloy solder paste 120. The printing step deposits the paste 120 in the openings in the mask to create the desired preform shapes. The solder paste is reflowed. The reflow temperature is selected such that the low temperature solder alloy is melted or liquefied, but the higher temperature alloy remains in its original and unmelted, solid state. In the preferred embodiment the peak reflow temperature would be 165° C. At this temperature, only the low temperature solder alloy liquefies. The higher temperature solder spheres remain intact and, upon cooling below its melt temperature, the low temperature solder alloy solidifies. This process of partial melting creates a flat, uniform, solid solder preform. Additional operations may be performed on the reflowed substrate and preforms to remove foreign materials, such as flux residue and excess solder balls. This is typically performed in the art by cleaning with aqueous or organic cleaning agents.

Figure 2:
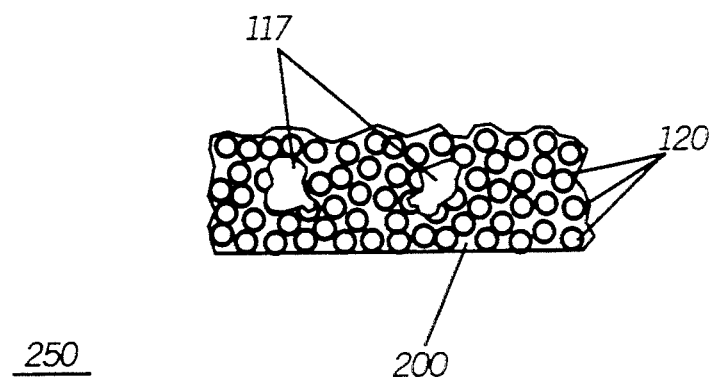
FIG. 2 is a cross sectional view of the solder preform after reflow, in accordance with the invention.

At this point, the non-wettable substrate has a thick, but uniform and substantially flat layer of solder preforms. These solder preforms consist of a mixture of the reflowed or melted low temperature solder alloy which has distributed within it a matrix of solder particles or solder spheres of the unreflowed high temperature solder alloy. The high temperature alloy particles or spheres are surrounded by and embedded in the low temperature alloy, forming a structure that appears in cross-sectional view in FIG. 2. The low temperature material 200 is melted and has partially alloyed to the high temperature alloy 210. The high temperature alloy 210 remains essentially intact, but is surrounded and captured in a matrix of the melted low temperature alloy 200. The low temperature alloy 115 serves to 'bind' the unmelted high temperature alloy particles 120 together to form a single mass. In practice, some voids or empty spaces 117 may be formed in the solder mass upon cooling. These voids 117 are the result of inefficiencies in the packing of the solder particles and/or the volatiles evolved from the flux and vehicle during the heating process.

It is postulated that the low temperature material has alloyed or formed a metallurgical bond to the high temperature solder material during the reflow process, thereby adding to the mechanical integrity of the resulting solder mass. The formation of the metallurgical bond is thought to occur by diffusion between the molten metal alloy and the solid metal during reflow.

After reflow and cooling, the preforms are easily ejected from the openings in the mask, because the solder has not wet to the substrate or the mask. The solder preforms may now be used in an assembly or repair process similar to that used with conventional printed circuit boards; that is, the PCB is fluxed, and components or parts are placed at the desired spots with the solderable portions of the parts in contact with the reflowed solder preform. The assembly is now reflowed at a temperature sufficient to reflow both the low and the high temperature solder alloy, in conventional manner. This provides the metallurgical joint.

Clearly, it can be seen that this invention provides the advantage of the creation of flat, uniform solder preforms due to the presence of unmelted particles of solder in the reflowed low-melting alloy. This creates a surface on the solder preform that is highly suitable for retention of any flux or tacking agent dispensed on the preform. It can be seen that this invention may be used to repair assembled printed circuit boards or other type of substrates, and may further be used to provide an assembly process for assembling and soldering other types of products, such as metal fabrication. While the preferred embodiments of the invention have been illustrated and described, it will be clear that the invention is not so limited. Numerous modifications, changes, variations, substitutions and equivalents will occur to those skilled in the art without departing from the spirit and scope of the present invention as defined by the appended claims.

We claim:

1. A solder preform, comprising:
   a plurality of particles of a first solder material having a predetermined solidus temperature;
   a second solder material compositionally distinct from the first solder material and having a predetermined liquidus temperature that is less than the predetermined solidus temperature of the first solder material; and
   the first solder material particles embedded within and bound together by a matrix of the second solder material, forming said solder preform.

2. The solder preform of claim 1, wherein the particles of the first solder material comprise about 88% by weight and the second solder material comprises about 12% by weight.

3. The solder preform of claim 1, wherein the second solder material is alloyed to the first solder particles.

4. The solder preform of claim 1, wherein the first solder particles are selected from the group consisting of tin, lead, bismuth, indium, copper, antimony, cadmium, arsenic, aluminum, gallium, gold, silver and alloys thereof.

5. The solder preform of claim 1, wherein the second solder material is selected from the group consisting of tin, lead, bismuth, indium, copper, antimony, cadmium, arsenic, aluminum, gallium, gold, silver and alloys thereof.

6. A solder preform of a predetermined shape, comprising:
   a soldering composition having first solder particles arranged within a matrix of a second solder alloy to form a solid mass having the predetermined shape;
   the first solder particles comprising one or more elements selected from the group consisting of tin, lead, bismuth, indium, copper, antimony, cadmium, arsenic, aluminum, gallium, gold and silver, the particles having a first melting temperature; and
   the second solder alloy compositionally distinct from the first solder particles and having a melting temperature less than the first melting temperature.

7. The solder preform of claim 6, wherein the first solder particles comprise about 88% by weight and the second solder alloy comprises about 12% by weight.

8. The solder preform of claim 6, wherein the second solder material is alloyed to the first solder particles.

9. The solder preform of claim 6, wherein the second solder alloy comprises one or more elements selected from the group consisting of tin, lead, bismuth, indium, copper, antimony, cadmium, arsenic, aluminum, gallium, gold and silver.

10. A solder preform, comprising:
    a soldering composition having first solder particles arranged within a matrix of a second solder alloy to form a solid mass having the predetermined shape;
    the first solder particles comprising an alloy of 62% tin, 36% lead and 2% silver, and having a melting temperature of about 179°–181° C.;
    the second solder alloy comprising an alloy of 43% tin, 43% lead and 14% bismuth, and having a melting range of about 144°–163° C.; and
    the soldering composition comprising about 88% by weight of the first solder particles and about 12% by weight of the second solder alloy.

11. The solder preform of claim 10, wherein the second solder material is alloyed to the first solder particles.

* * * * *